(12) United States Patent
Ko et al.

(10) Patent No.: US 10,467,973 B2
(45) Date of Patent: Nov. 5, 2019

(54) BUFFER AMPLIFIER CIRCUIT FOR ENHANCING THE SLEW RATE OF AN OUTPUT SIGNAL AND DEVICES INCLUDING THE SAME

(71) Applicant: Samsung Electronics Co., Ltd., Suwon-si (KR)

(72) Inventors: Ju Hyun Ko, Yongin-si (KR); Yong Joo Song, Hwaseong-si (KR); Jun Ho Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 122 days.

(21) Appl. No.: 15/206,500

(22) Filed: Jul. 11, 2016

(65) Prior Publication Data

US 2017/0032755 A1  Feb. 2, 2017

(30) Foreign Application Priority Data

Jul. 29, 2015 (KR) .................. 10-2015-0107518

(51) Int. Cl.
*G09G 3/36* (2006.01)
*H03F 3/45* (2006.01)
*H03F 3/30* (2006.01)

(52) U.S. Cl.
CPC ......... *G09G 3/3648* (2013.01); *G09G 3/3688* (2013.01); *H03F 3/3022* (2013.01); *H03F 3/45219* (2013.01); *H03F 3/45475* (2013.01); *G09G 3/3614* (2013.01); *G09G 2300/0426* (2013.01); *G09G 2310/0291* (2013.01); *G09G 2310/08* (2013.01); *G09G 2370/08* (2013.01); *H03F 2203/45248* (2013.01)

(58) Field of Classification Search
CPC .. G09G 3/3648; G09G 3/3688; G09G 3/3614; G09G 2300/0426; G09G 2310/0291; G09G 2310/08; G09G 2370/08; H03F 3/3022; H03F 3/45219; H03F 3/45475; H03F 2203/45248
See application file for complete search history.

(56) References Cited

U.S. PATENT DOCUMENTS

| 6,310,520 | B1 | 10/2001 | Walden |
| 6,741,129 | B1 | 5/2004 | Corsi et al. |
| 7,760,199 | B2 | 7/2010 | An |
| 8,081,150 | B2 | 12/2011 | An |
| 8,599,179 | B2 | 12/2013 | Kim et al. |
| 8,648,637 | B2 | 2/2014 | Kim et al. |
| 2006/0279356 | A1* | 12/2006 | An .................. H03F 3/45219 330/253 |
| 2008/0180174 | A1* | 7/2008 | Kim .................. H03F 1/083 330/253 |
| 2010/0097142 | A1 | 4/2010 | Liang et al. |
| 2010/0134471 | A1 | 6/2010 | Seo et al. |
| 2010/0149171 | A1 | 6/2010 | Huang et al. |
| 2010/0164929 | A1 | 7/2010 | Chen et al. |

(Continued)

*Primary Examiner* — Stacy Khoo
(74) *Attorney, Agent, or Firm* — Onello & Mello, LLP

(57) ABSTRACT

A buffer amplifier circuit includes a buffer amplifier including a first differential amplifier having a first active load and a second differential amplifier having a second active load and a feedback circuit configured to feed an output signal of an output terminal of the buffer amplifier back to one of the first and second active loads using differential switch signals and an input signal of the buffer amplifier to enhance a slew rate of the output signal.

20 Claims, 10 Drawing Sheets

(56) References Cited

U.S. PATENT DOCUMENTS

| | | | |
|---|---|---|---|
| 2010/0264957 A1* | 10/2010 | Tamaoka | H03K 17/145 327/109 |
| 2011/0018853 A1 | 1/2011 | Kawagoshi | |
| 2011/0050677 A1 | 3/2011 | Tsai et al. | |
| 2012/0280965 A1 | 11/2012 | Lee | |
| 2014/0375384 A1 | 12/2014 | Bohannon et al. | |
| 2015/0084694 A1 | 3/2015 | Lee | |

\* cited by examiner

BUFFER AMPLIFIER CIRCUIT FOR ENHANCING THE SLEW RATE OF AN OUTPUT SIGNAL AND DEVICES INCLUDING THE SAME

CROSS-REFERENCE TO RELATED APPLICATION

This application claims priority under 35 U.S.C. § 119(a) from Korean Patent Application No. 10-2015-0107518 filed on Jul. 29, 2015, the disclosure of which is hereby incorporated by reference in its entirety.

FIELD

Embodiments of the inventive concept relate to a semiconductor device, and more particularly, to a buffer amplifier circuit for enhancing a slew rate of an output signal during a charge-sharing operation and devices including the same.

BACKGROUND

Liquid crystal display (LCD) devices are widely used in portable electronic devices such as cellular phones, smart phones, table personal computers (PCs), and other portable devices. An LCD driver includes column drivers, row drivers, and a timing controller. Given the surge in the variety and amount of devices now using display devices, demand for low power consumption and high display quality of LCD devices has increased.

The LCD driver uses charge sharing to efficiently manage the power consumption of row drivers. In accordance with the concept of charge sharing, the longer a charge sharing time, the lower the power consumption of the row drivers. However, as the charge sharing time increases, the charge time of each of the row drivers decreases, and therefore, each of the row drivers may not charge an output voltage up to an original data level. As a result, the slew rate of the output voltage may decrease.

SUMMARY

According to various aspects of the inventive concept, there is provided a buffer amplifier circuit including a buffer amplifier and a feedback circuit. The buffer amplifier includes a first differential amplifier having a first active load and a second differential amplifier having a second active load. The feedback circuit feeds an output signal of an output terminal of the buffer amplifier back to one of the first and second active loads using differential switch signals and an input signal of the buffer amplifier to enhance a slew rate of the output signal.

In an embodiment, the feedback circuit may include a first transmission circuit configured to transmit the output signal to the first active load in response to the input signal and one of the differential switch signals and a second transmission circuit configured to transmit the output signal to the second active load in response to the input signal and the other one of the differential switch signals.

In an embodiment, the first active load may enhance a falling slew rate of the output signal and the second active load may enhance a rising slew rate of the output signal.

In an embodiment, the first active load may include P-channel metal oxide semiconductor (PMOS) transistors. The output signal of the buffer amplifier may control a gate voltage of the PMOS transistors to enhance the falling slew rate. The second active load may include N-channel metal oxide semiconductor (NMOS) transistors. The output signal of the buffer amplifier may control a gate voltage of the NMOS transistors to enhance the rising slew rate.

In an embodiment, the buffer amplifier may further include a pull-up circuit configured to pull the output signal up to a first voltage in response to an output signal of the first active load and a pull-down circuit configured to pull the output signal down to a second voltage in response to an output signal of the second active load.

According to other aspects of the inventive concept, there is provided a source driver including a first source line, a first buffer amplifier circuit connected to the first source line through a first switch, and a first charge sharing line connected to the first source line through a second switch. The first buffer amplifier circuit may include a first buffer amplifier including a first differential amplifier having a first active load and a second differential amplifier having a second active load and a first feedback circuit configured to feed a first output signal of a first output terminal of the first buffer amplifier back to one of the first and second active loads using first differential switch signals related with a control signal for controlling the second switch and a first input signal of the first buffer amplifier to enhance a slew rate of the first output signal.

In an embodiment, the first feedback circuit may include a first transmission circuit configured to transmit the first output signal to the first active load in response to the first input signal and one of the first differential switch signals and a second transmission circuit configured to transmit the first output signal to the second active load in response to the first input signal and the other one of the first differential switch signals. The first active load may enhance a falling slew rate of the first output signal and the second active load may enhance a rising slew rate of the first output signal.

In an embodiment, the first active load may include PMOS transistors. The first output signal of the first buffer amplifier may control a gate voltage of the PMOS transistors to enhance the falling slew rate. The second active load may include NMOS transistors. The first output signal of the first buffer amplifier may control a gate voltage of the NMOS transistors to enhance the rising slew rate.

In an embodiment, the first buffer amplifier may further include a pull-up circuit configured to pull the first output signal up to a first voltage in response to an output signal of the first active load and a pull-down circuit configured to pull the first output signal down to a second voltage in response to an output signal of the second active load.

In an embodiment, the source driver may further include a second source line, a second buffer amplifier circuit connected to the second source line through a third switch, and a second charge sharing line connected to the second source line through a fourth switch. The second buffer amplifier circuit may include a second buffer amplifier including a third differential amplifier having a third active load and a fourth differential amplifier having a fourth active load and a second feedback circuit configured to feed a second output signal of a second output terminal of the second buffer amplifier back to one of the third and fourth active loads using second differential switch signals related with a control signal for controlling the fourth switch and a second input signal of the second buffer amplifier to enhance a slew rate of the second output signal.

In an embodiment, the first source line may be one among odd-numbered source lines and the second source line may be one among even-numbered source lines. Connection between the first source line and the first charge sharing line and connection between the second source line and the second charge sharing line may be performed at the same time.

According to further aspects of the inventive concept, there is provided a display system including a row driver, a source driver, and a controller connected to the row driver and the source driver. The source driver may include a first source line, a first buffer amplifier circuit connected to the first source line through a first switch, and a first charge sharing line connected to the first source line through a second switch. The first buffer amplifier circuit may include a first buffer amplifier including a first differential amplifier having a first active load and a second differential amplifier having a second active load and a first feedback circuit configured to feed a first output signal of a first output terminal of the first buffer amplifier back to one of the first and second active loads using first differential switch signals related with a control signal for controlling the second switch and a first input signal of the first buffer amplifier to enhance a slew rate of the first output signal.

According to yet further aspects of the inventive concept, in a buffer amplifier including a first differential amplifier having a first active load and a second differential amplifier having a second active load, a method includes feeding an output signal of an output terminal of the buffer amplifier back to one of the first active load and second active load using differential switch signals and an input signal of the buffer amplifier to enhance a slew rate of the output signal.

In an embodiment, the method may further include transmitting the output signal to the first active load in response to the input signal and one of the differential switch signals; and transmitting the output signal to the second active load in response to the input signal and the other one of the differential switch signals.

In an embodiment, the method may further include enhancing, by the first active load, a falling slew rate of the output signal and enhancing, by the second active load, a rising slew rate of the output signal.

In an embodiment, the method may further include controlling, with the output signal of the buffer amplifier, a gate voltage of P-channel metal oxide semiconductor (PMOS) transistors of the first active load to enhance the falling slew rate; and controlling, with the output signal of the buffer amplifier, a gate voltage of N-channel metal oxide semiconductor (NMOS) transistors of the second active load to enhance the rising slew rate.

In an embodiment, the method may further include pulling the output signal up to a first voltage in response to an output signal of the first active load; and pulling the output signal down to a second voltage in response to an output signal of the second active load.

BRIEF DESCRIPTION OF THE DRAWINGS

Exemplary embodiments of one or more new and useful process, machine, manufacture, and/or improvement thereof, in accordance with the inventive concept, are provided in the following detailed description taken in conjunction with the accompanying drawings, in which.

DETAILED DESCRIPTION OF THE EMBODIMENTS

Figure 1:
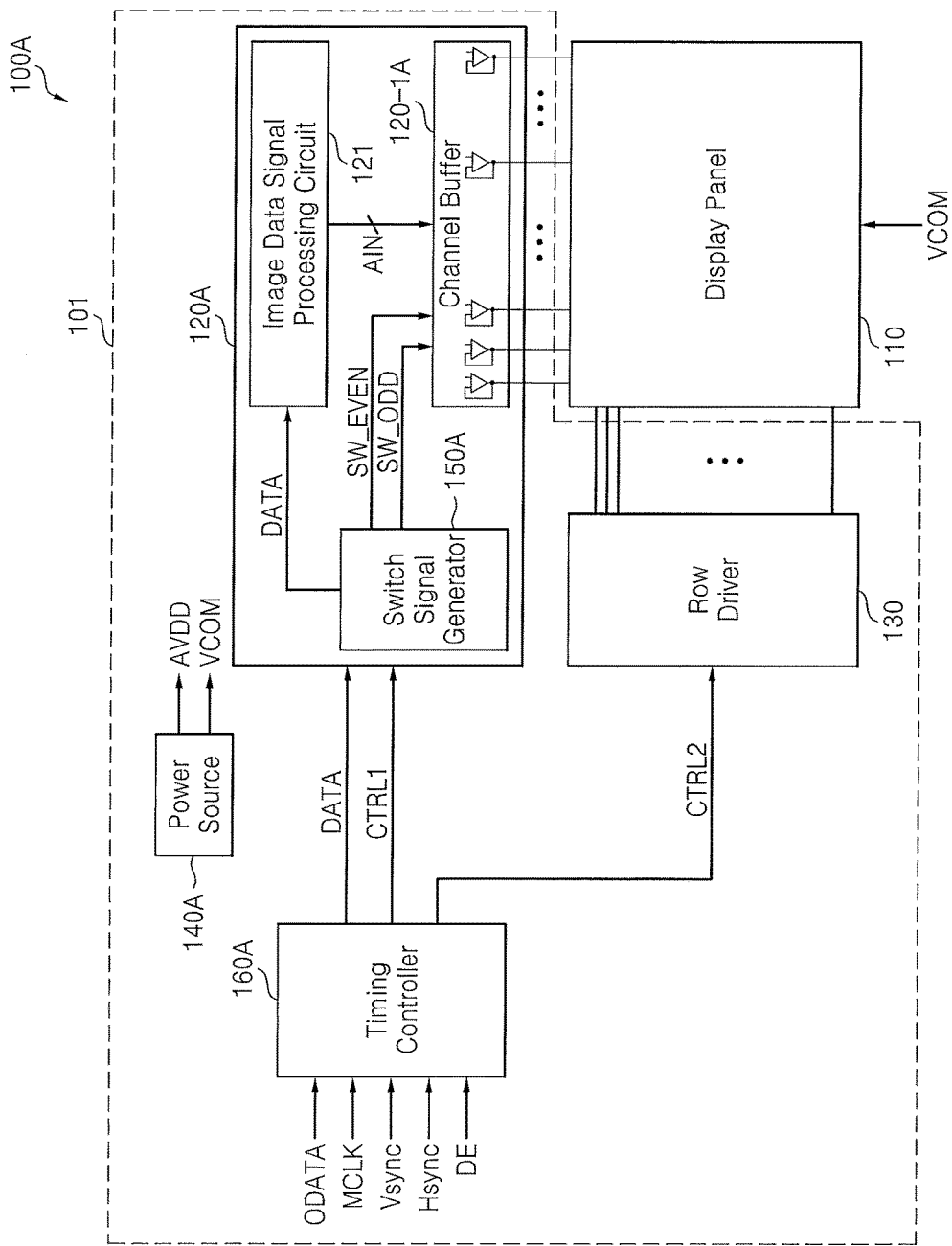
FIG. 1 is a schematic block diagram of a display module according to aspects of the present inventive concept.

Aspects of the inventive concept will now be described more fully with reference to the accompanying drawings, in which exemplary embodiments are shown. The inventive concept may, however, be embodied in many different forms and should not be construed as limited to the exemplary embodiments set forth herein. Reference numerals are denoted in detail in the exemplary embodiments of the inventive concept and their examples are indicated in the accompanying drawings. The same reference numerals are used in the description and drawings in order to refer to the same or similar parts wherever possible.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

To the extent that functional features, operations, and/or steps are described herein, or otherwise understood to be included within various embodiments of the inventive concept, such functional features, operations, and/or steps can be embodied in functional blocks, units, modules, operations and/or methods. And to the extent that such functional blocks, units, modules, operations and/or methods include computer program code, such computer program code can be stored in a computer readable medium, e.g., such as non-transitory memory and media, that is executable by at least one computer processor.

FIG. 1 is a schematic block diagram of a display module 100A according to aspects of the inventive concept. Referring to FIG. 1, the display module 100A includes a display panel 110, a source driver 120A, a row driver 130, a power source 140A, and a timing controller 160A.

The display panel 110 includes a plurality of data lines, a plurality of gate (or row) lines, and a plurality of pixels. The display panel 110 may be a thin film transistor-liquid crystal display (TFT-LCD) panel, a light emitting diode (LED) display panel, an organic LED (OLED) display panel, an active-matrix OLED (AMOLED) display panel, or a flexible display panel, but is not restricted thereto. For example, the display panel 110 may be implemented to be suitable to column inversion, Z-inversion, dot inversion, or a combination thereof.

The source driver 120A provides the display panel 110 with image signals AIN corresponding to image data DATA suitable to the column inversion, the Z-inversion, or the dot inversion. The source driver 120A may be implemented in an integrated circuit (IC), chip, or semiconductor package. Although one source driver 120A is illustrated in FIG. 1, a plurality of source drivers may be used to drive the display panel 110 in other embodiments of the inventive aspects.

The source driver 120A includes a channel buffer 120-1A, an image data signal processing circuit 121, and a switch signal generator 150A. The channel buffer 120-1A, which performs the function of an output circuit, drives the image signals AIN to data lines of the display panel 110.

The image data signal processing circuit 121 processes the image data DATA and generates the image signals MN which can be processed by a plurality of buffer amplifier circuits included in the channel buffer 120-1A. The image data DATA may have an RGB format, a YUV format, a YCbCr format, or YCoCg format; however, the format of the image data DATA is not restricted to these examples. For example, the image data signal processing circuit 121 may generate the analog image signals AIN corresponding to the digital image data DATA.

The switch signal generator 150A generates charge sharing switch signals SW_ODD and SW_EVEN based on a first control signal CTRL1. The switch signal generator 150A transmits the image data DATA to the image data signal processing circuit 121.

The row driver 130 drives each of row lines arranged in the display panel 110. Pixels included in the display panel 110 display an image corresponding to the image data DATA according to the control of the source driver 120A and the row driver 130.

The power source 140A generates a first operating voltage AVDD and a common voltage VCOM. The first operating voltage AVDD is provided to the source driver 120A and the common voltage VCOM is provided to the display panel 110.

The timing controller 160A generates the first control signal CTRL1 for the operation of the source driver 120A and a second control signal CTRL2 for the operation of the row driver 130 in response to a master clock signal MCLK, a vertical synchronization signal Vsync, a horizontal synchronization signal Hsync, and a data enable signal DE. The timing controller 160A processes original image data ODATA and transmits the image data DATA generated as the processing result to the source driver 120A. The timing controller 160A provides the image data DATA and a clock signal for the source driver 120A using serial interface. The clock signal may be the master clock signal MCLK itself or a signal related with the master clock signal MCLK.

A display driver IC (DDI), e.g., a mobile DDI 101 may include the source driver 120A, the row driver 130, the power source 140A, and the timing controller 160A.

Figure 2:
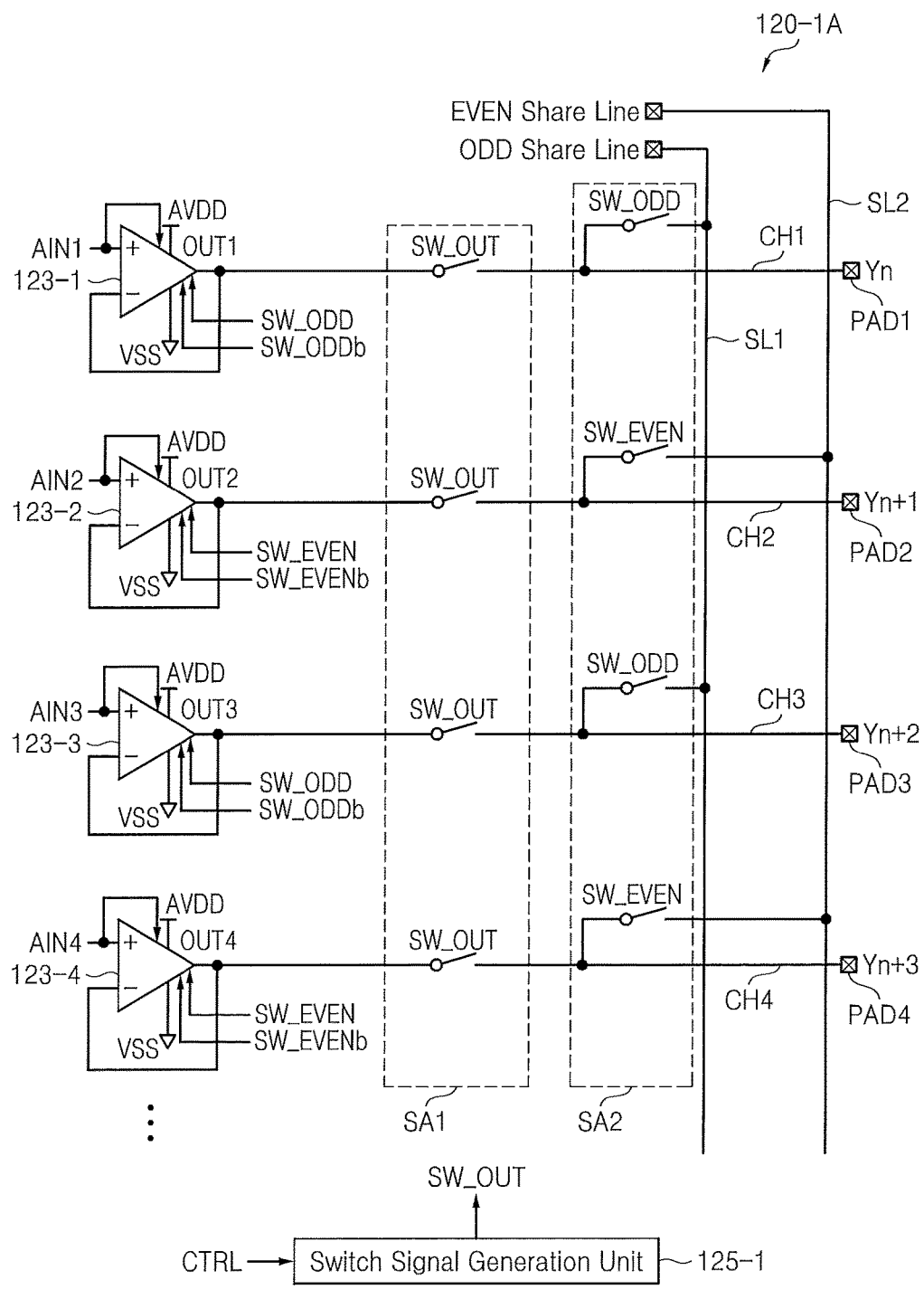
FIG. 2 is a schematic diagram of an embodiment of the channel buffer illustrated in FIG. 1.

FIG. 2 is a schematic block diagram of an embodiment of the channel buffer 120-1A illustrated in FIG. 1. The switch signal generator 150A illustrated in FIG. 1 generates the charge sharing switch signals SW_ODD and SW_EVEN for controlling a charge sharing operation between source lines CH1 through CH4 illustrated in FIG. 2.

A switch signal generation unit 125-1 generates a switch signal SW_OUT in response to a control signal CTRL For example, the control signal CTRL may be generated based on the first control signal CTRL1.

For example, when the switch signal SW_OUT is activated and the charge sharing switch signals SW_ODD and SW_EVEN are deactivated, output signals OUT1 through OUT4 of respective buffer amplifier circuits 123-1 through 123-4 are transmitted to pads PAD1 through PAD4, respectively, through the source lines CH1 through CH4, respectively. Each of the buffer amplifier circuits 123-1 through 123-4 comprise a source driver amplifier.

However, when the switch signal SW_OUT is deactivated and the charge sharing switch signals SW_ODD and SW_EVEN are activated, the output terminals of the respective buffer amplifier circuits 123-1 through 123-4 are disconnected from the respective source lines CH1 through CH4. At this time, the odd-numbered source lines CH1 and CH3 are connected to a first charge-sharing line SL1 and the even-numbered source lines CH2 and CH4 are connected to a second charge-sharing line SL2.

The first charge-sharing line SL1 and the second charge-sharing line SL2 are separated from each other in the embodiments illustrated in FIG. 2. However, the first charge-sharing line SL1 and the second charge-sharing line SL2 may be implemented in a single charge sharing line. In such a case, the charge sharing switch signals SW_ODD and SW_EVEN may be the same as each other.

When the first charge-sharing line SL1 and the second charge-sharing line SL2 are separated from each other, a switch may be placed between the first charge-sharing line SL1 and the second charge-sharing line SL2. In such a case, a switch signal for controlling the switch may be generated by the switch signal generator 150A.

Although the switch signal generation unit 125-1 is included within the channel buffer 120-1A in the embodiments illustrated in FIG. 2, the switch signal generation unit 125-1 may be separate from the channel buffer 120-1A.

The channel buffer 120-1A includes buffer amplifier circuits 123-1 through 123-4, a first switch array SA1, a second switch array SA2, the first charge-sharing line SL1, the second charge-sharing line SL2, the source lines CH1 through CH4, and the output pads PAD1 through PAD4. The buffer amplifier circuits 123-1 through 123-4 may respectively buffer image signals AIN1 through AIN4 output from the image data signal processing circuit 121 (FIG. 1).

Although four buffer amplifier circuits 123-1 through 123-4 are illustrated in FIG. 2, this is just an example, and any number of buffer amplifier circuits may be utilized in the channel buffer 120-1A, as necessary for various implementations. Each of the buffer amplifier circuits 123-1 through 123-4 may be implemented as a unit gain buffer, but the inventive concept is not restricted to the current embodiments.

The odd-numbered buffer amplifier circuits 123-1 and 123-3 among the buffer amplifier circuits 123-1 through 123-4 may respectively buffer the image signals AIN1 and AIN3 having a first polarity. The even-numbered buffer amplifier circuits 123-2 and 123-4 among the buffer amplifier circuits 123-1 through 123-4 may respectively buffer the image signals AIN2 and AIN4 having a second polarity.

The buffer amplifier circuits 123-1 through 123-4 respectively output the image signals AIN1 through AIN4, which swing between the first operating voltage AVDD and a ground voltage VSS. One of the first and second polarities may indicate a voltage higher than the common voltage VCOM and the other one of the first and second polarities may indicate a voltage lower than the common voltage VCOM. In an embodiment of the inventive concept, the buffer amplifier circuits 123-1 through 123-4 have the same structure and perform the same operations, and therefore, the structure and operations of the first buffer amplifier circuit 123-1 will be representatively described with reference to FIGS. 3 through 5B.

During a charge-sharing operation, the first buffer amplifier circuit 123-1 buffers the input signal AIN1 using differential charge-sharing switch signals SW_ODD and SW_ODDb and the input signal AIN1 and generates the output signal OUT1 having a fast slew rate. During the charge-sharing operation, the second buffer amplifier circuit 123-2 buffers the input signal AIN2 using differential charge-sharing switch signals SW_EVEN and SW_EVENb and the input signal AIN2 and generates the output signal OUT2 having a fast slew rate. During the charge-sharing operation, the third buffer amplifier circuit 123-3 buffers the input signal AIN3 using the differential charge-sharing switch signals SW_ODD and SW_ODDb and the input signal AIN3 and generates the output signal OUT3 having a fast slew rate. During the charge-sharing operation, the fourth buffer amplifier circuit 123-4 buffers the input signal AIN4 using the differential charge-sharing switch signals SW_EVEN and SW_EVENb and the input signal AIN4 and generates the output signal OUT4 having a fast slew rate.

The first switch array SA1 includes a plurality of first switches and controls the connection and disconnection between the output terminal of each of the buffer amplifier circuits 123-1 through 123-4 and a corresponding one of the source lines CH1 through CH4 in response to a switch signal SW_OUT.

For example, during an active period (ACT in FIG. 3) of each of the frames 1FRAME and 2FRAME (or, for example, during an image display period), the switch signal SW_OUT is activated, so that each of the first switches included in the first switch array SA1 connects the output terminal of a corresponding one of the buffer amplifier circuits 123-1 through 123-4 to a corresponding one of the source lines CH1 through CH4.

However, during a charge-sharing period (HB or VB in FIG. 3), the switch signal SW_OUT is deactivated. As a result, the output terminals of the buffer amplifier circuits 123-1 through 123-4 are disconnected from the source lines CH1 through CH4 by the respective first switches included in the first switch array SA1. For example, the charge-sharing period HB or VB may be the period HB between lines or the period VB between frames.

Figure 3:
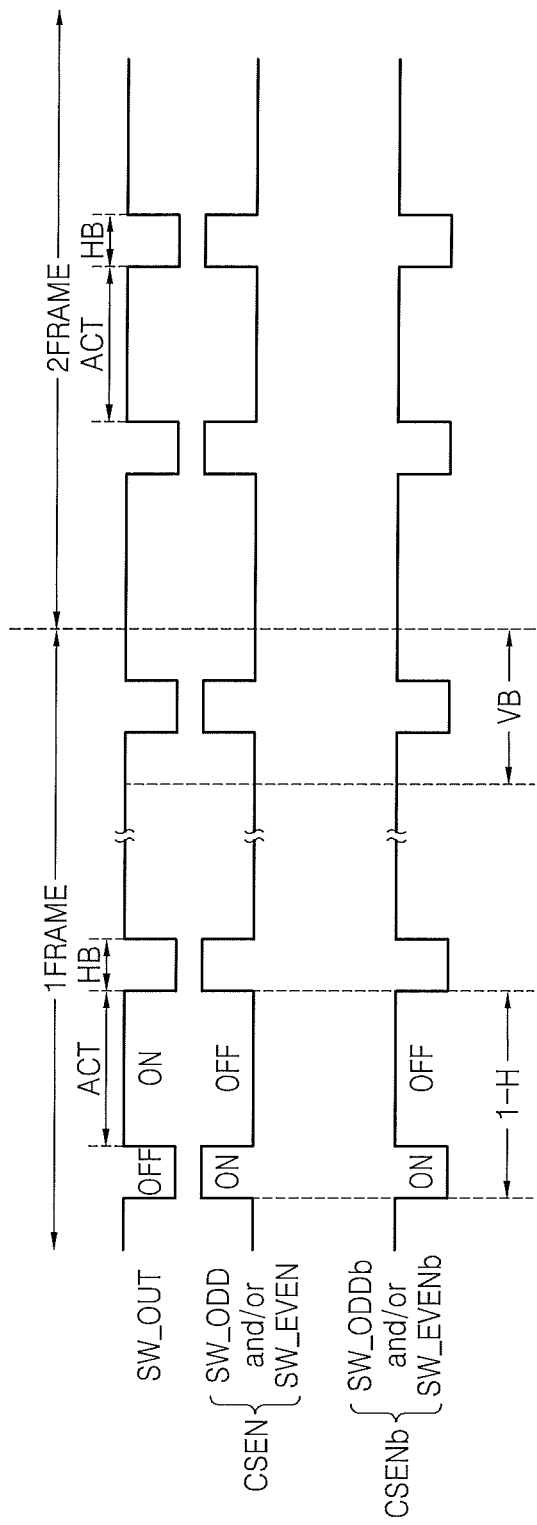
FIG. 3 is a timing chart of control signals for controlling certain of the switches illustrated in FIG. 2.

As shown in FIG. 3, the phase of the switch signal SW_OUT is opposite to that of the charge sharing switch signal SW_ODD and/or SW_EVEN. For example, each of the charge-sharing switch signals SW_ODD and SW_EVEN are activated for only a predetermined period of time whenever a line or a frame changes. In FIG. 3, "1-H" denotes a one-line time, i.e., a 1-line time.

In some embodiments, the charge-sharing period HB or VB may be a horizontal blank interval BB or a vertical blank interval VB, respectively. Here, the horizontal blank interval HB is a time difference between a current line and a subsequent line and the vertical blank interval VB is a time difference between the last line of a current frame and the first line of a subsequent frame.

The second switch array SA2 includes a first switch group and a second switch group. The first switch group includes first sub-switches (or odd-numbered switches). The first sub-switches control the connection between the first charge sharing line SL1 and the respective odd-numbered source lines CH1 and CH3 among the source lines CH1 through CH4 in response to the first charge-sharing switch signal SW_ODD.

The second switch group includes second sub-switches (or even-numbered switches). The second sub-switches control the connection between the second charge sharing line SL2 and the respective even-numbered source lines CH2 and CH4 among the source lines CH1 through CH4 in response to the second charge-sharing switch signal SW_EVEN.

For example, the first charge sharing line SL1 and the second charge sharing line SL2 may be separated from each other and may be in a floating state. The output pads PAD1 through PAD4 respectively connected to the source lines CH1 through CH4 may be connected to a plurality of data lines in the display panel 110.

The first charge sharing switch signal SW_ODD and the second charge sharing switch signal SW_EVEN may be activated at the same time or at different timings. During the charge-sharing periods HB and VB, only one of the first charge-sharing switch signal SW_ODD and the second charge-sharing switch signal SW_EVEN may be activated.

During each of the frame periods 1FRAME and 2FRAME, charges of source lines respectively transmitting image signals having the same polarity may be shared. In an embodiment of the inventive concept, the source lines CH1 through CH4 are signal lines that transmit the output signals OUT1 through OUT4 of the respective buffer amplifier circuits 123-1 through 123-4 to the output pads PAD1 through PAD4, respectively. Each source line may be called a channel.

Although the term "output pad" is used to refer to connection means for electrically connecting a source line of the source driver 120A-1A with a data line of the display panel 110 in the description of FIG. 2 for convenience' sake, it is just an example. The name and structure of the connection means may be variously changed.

When a charge-sharing operation is necessary, the output terminals of the buffer amplifier circuits 123-1 through 123-4 are disconnected, by first switch array SA1, from the respective source lines CH1 through CH4 during each charge-sharing period BB or VB while the first charge-sharing line SL1 is connected with the odd-numbered source lines CH1 and CH3 and the second charge-sharing line SL2 is connected with the even-numbered source lines CH2 and CH4.

In other words, the charge-sharing operation is performed on the odd-numbered source lines CH1 and CH3, which respectively transmit the image signals AIN1 and AIN3 having the first polarity, using the first charge-sharing line SL1; and the charge-sharing operation is performed on the even-numbered source lines CH2 and CH4, which respectively transmit the image signals AIN2 and AIN4 having the second polarity, using the second charge-sharing line SL2.

FIG. 3 is a timing chart of control signals for controlling switches illustrated in FIG. 2. Referring to FIG. 3, at least one charge-sharing switch signal SW_ODD and/or SW_EVEN are collectively denoted by a charge sharing switch signal CSEN and at least one complementary charge sharing switch signal SW_ODDb and/or SW_EVENb are collectively denoted by a complementary charge sharing switch signal CSENb. The charge-sharing switch signals SW_ODD and SW_ODDb may be differential signals or complementary signals and the charge sharing switch signals SW_EVEN and SW_EVENb may be differential signals or complementary signals.

Figure 4:
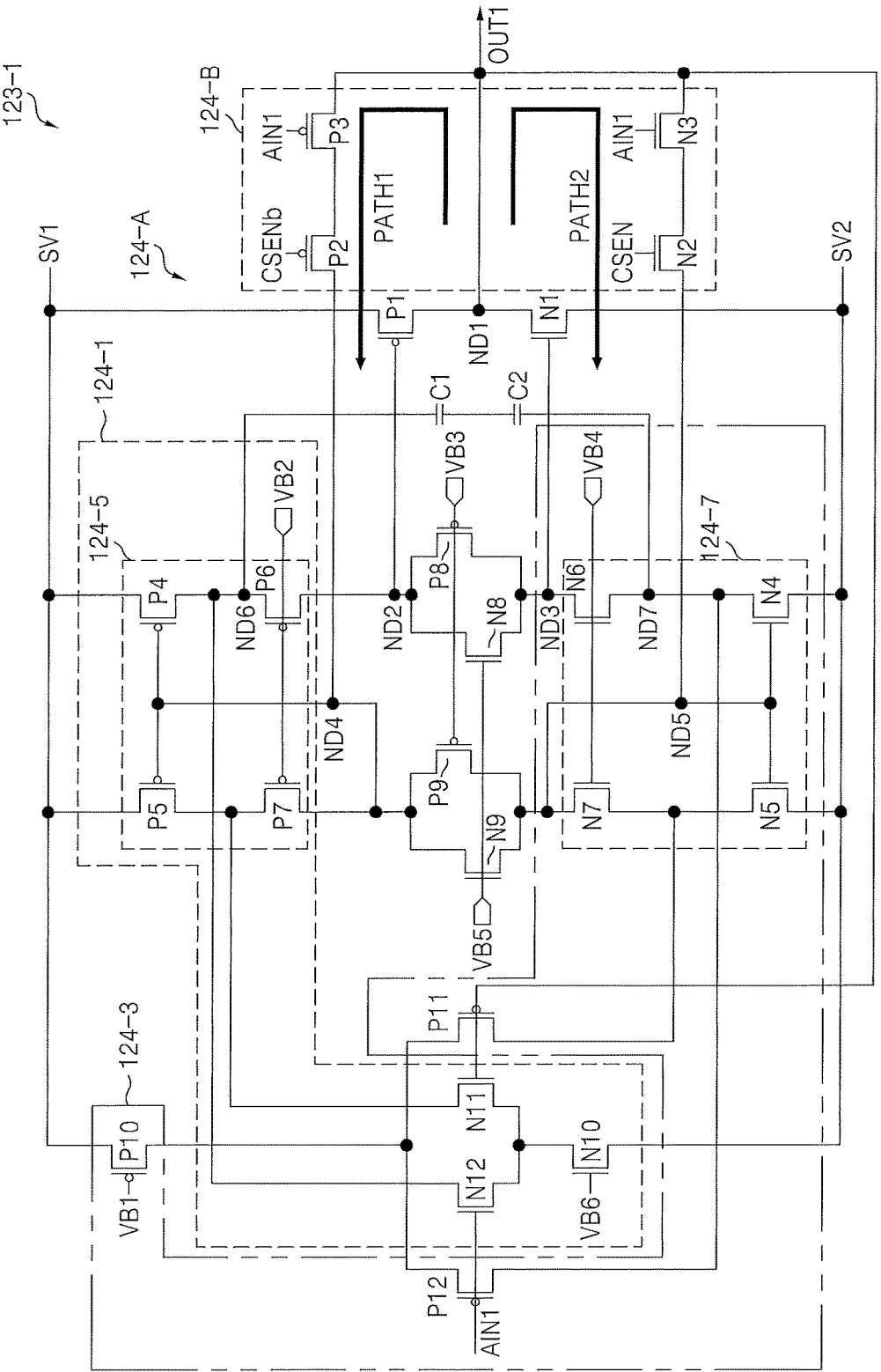
FIG. 4 is a schematic diagram of an embodiment of the first buffer amplifier circuit illustrated in FIG. 2.

FIG. 4 is a schematic diagram of an embodiment of the first buffer amplifier circuit 123-1 illustrated in FIG. 2. Referring to FIGS. 1 through 4, the buffer amplifier circuit 123-1 includes a buffer amplifier 124-A and a feedback circuit 124-B.

The buffer amplifier 124-A includes a first differential amplifier 124-1 including a first active load 124-5 and a second differential amplifier 124-3 including a second active load 124-7.

N-channel metal oxide semiconductor (NMOS) transistors N11 and N12 of the first differential amplifier 124-1 amplify the difference between the input signals AIN1 and OUT1 and output first amplified differential signals to the first active load 124-5. MOS transistors P4 through P7 included in the first active load 124-5 may be P-channel MOS (PMOS) transistors. The MOS transistors P4 through P7 form a current mirror for current sourcing. A second bias voltage VB2 is applied to the gate of each of the PMOS transistors P6 and P7.

A sixth bias voltage VB6 is applied to an NMOS transistor N10 connected to the tail of the first differential amplifier 124-1.

PMOS transistors P11 and P12 of the second differential amplifier 124-3 amplify the difference between the input signals AIN1 and OUT1 and output second amplified differential signals to the second active load 124-7. MOS transistors N4 through N7 included in the second active load 124-7 may be NMOS transistors. The MOS transistors N4 through N7 form a current mirror for current sinking. A fourth bias voltage VB4 is applied to the gate of each of the NMOS transistors N6 and N7.

A first bias voltage VB1 is applied to a PMOS transistor P10 connected to the tail of the second differential amplifier 124-3.

A bias circuit is connected between nodes ND2 and ND4 connected to the first active load 124-5 and nodes ND3 and ND5 connected to the second active load 124-7. The bias circuit includes MOS transistors P8, P9, N8, and N9. A third bias voltage VB3 is applied to the gate of each of the PMOS transistors P8 and P9 and a fifth bias voltage VB5 is applied to the gate of each of the NMOS transistors N8 and N9. Capacitors C1 and C2 are connected in series between nodes ND6 and ND7.

The buffer amplifier 124-A includes a pull-up circuit P1 which pulls the output signal OUT1 up to a first voltage SV1 in response to an output signal of the first active load 124-5, i.e., a voltage of the node ND2 and a pull-down circuit N1 which pulls the output signal OUT1 down to a second voltage SV2 in response to an output signal of the second active load 124-7, i.e., a voltage of the node ND3. The pull-up circuit P1 may be a sourcing circuit and the pull-down circuit N1 may be a sinking circuit. For example, the first voltage SV1 may be the first operating voltage AVDD and the second voltage SV2 may be the ground voltage.

The feedback circuit 124-B feeds the output signal OUT1 of the output terminal ND1 of the buffer amplifier 124-A back to one of the first and second active loads 124-5 and 125-7, using the differential charge sharing switch signals CSEN and CSENb and the input signal AIN1 of the buffer amplifier 124-A, to enhance the slew rate of the output signal OUT1.

The feedback circuit 124-B includes a first transmission circuit PATH1 and a second transmission circuit PATH2. For example, the first transmission circuit PATH1 may refer to a first feedback circuit or a first transmission path. The first transmission circuit PATH1 transmits or feeds back the output signal OUT1 to the first active load 124-5 in response to the input signal AIN1 and one of the differential charge sharing switch signals CSEN and CSENb, e.g., the complementary charge sharing switch signal CSENb.

The second transmission circuit PATH2 may refer to a second feedback circuit or a second transmission path. The second transmission circuit PATH2 transmits or feeds back the output signal OUT1 to the second active load 124-7 in response to the input signal AIN1 and the other one of the differential charge sharing switch signals CSEN and CSENb, e.g., the charge sharing switch signal CSEN.

The first transmission circuit PATH1 includes switches P2 and P3 connected in series between the output terminal ND1 and the node ND4. For example, the switches P2 and P3 may be implemented as PMOS transistors. The complementary charge sharing switch signal CSENb is applied to the gate of the PMOS transistor P2 and the input signal AIN1 is applied to the gate of the PMOS transistor P3.

The second transmission circuit PATH2 includes switches N2 and N3 connected in series between the output terminal ND1 and the node ND5. For example, the switches N2 and N3 may be implemented as NMOS transistors. The charge sharing switch signal CSEN is applied to the gate of the NMOS transistor N2 and the input signal AIN1 is applied to the gate of the NMOS transistor N3.

For example, the MOS transistors N3 and P3 operate as comparators which compare the input signal AIN1 with the output signal OUT1. For example, when the input signal AIN1 of the buffer amplifier 124-A rises, that is, when the output signal OUT1 rises; the NMOS transistor N3 is turned on. When the input signal AIN1 of the buffer amplifier 124-A falls, that is, when the output signal OUT1 falls; the PMOS transistor P3 is turned on.

The MOS transistors N2 and P2 are control transistors enabled when a charge-sharing operation is performed.

When the input signal AIN1 rises (i.e., the output signal OUT1 rises or the output signal OUT1 to be output from the buffer amplifier 124-A is at a high level) in a charge-sharing period (e.g., CSEN=H and CSENb=L), the second transmission circuit PATH2 is enabled, and therefore, the output signal OUT1 is transmitted to the node ND5 through the second transmission circuit PATH2.

Accordingly, the gate voltage of the NMOS transistors N4 and N5 included in the second active load 124-7 increases, and therefore, the NMOS transistor N4 is turned on. As a result, the voltage of the node ND2 quickly falls down to the level of the ground voltage through the MOS transistors P8, N8, N6, and N4, which have been turned on. At this time, charges at the capacitors C1 and C2 are quickly discharged to ground through the MOS transistor N4 that has been turned on.

As the voltage of the node ND2 quickly decreases, the PMOS transistor P1 is quickly turned on. Therefore, the output signal OUT1 quickly rises (or is pulled up) to the first voltage SV1 (=AVDD). In other words, the rising slew rate of the output signal OUT1 is increased compared to what it otherwise would be.

When the input signal AIN1 falls (i.e., the output signal OUT1 falls or the output signal OUT1 to be output from the buffer amplifier 124-A is at a low level) in the charge-sharing period (e.g., CSEN=H and CSENb=L), the first transmission circuit PATH1 is enabled, and therefore, the output signal OUT1 is transmitted to the node ND4 through the first transmission circuit PATH1.

Accordingly, the gate voltage of the PMOS transistors P4 and P5 included in the first active load 124-5 decreases, and therefore, the PMOS transistor P4 is turned on. As a result, the voltage of the node ND2 quickly rises up to the first voltage SV1 (=AVDD). At this time, the capacitors C1 and C2 are quickly charged through the PMOS transistor P4 that has been turned on.

As the input signal AIN1 falls, the PMOS transistor P12 is turned on, and therefore, the voltage of the nodes ND3 and ND7 increases. Since the NMOS transistor N1 is quickly turned on, the output signal OUT1 quickly falls (or is pulled down) to the ground voltage SV2 (=VSS). In other words, the falling slew rate of the output signal OUT1 is increased compared to what it otherwise would be.

As described above, the first active load 124-5 enhances the falling slew rate of the output signal OUT1 and the second active load 124-7 enhances the rising slew rate of the output signal OUT1.

The first active load 124-5 includes the PMOS transistors P4 through P7. The output signal OUT1, at node ND1 of the buffer amplifier 124-A, which is applied (or fed back) to the node ND4 through the first transmission circuit PATH1, controls the gate voltage of the PMOS transistors P4 and P5, thereby quickening the falling slew of the output signal OUT1.

The second active load 124-7 includes the NMOS transistors N4 through N7. The output signal OUT1 of the buffer amplifier 124-A, which is applied (or fed back) to the node ND5 through the second transmission circuit PATH2, controls the gate voltage of the NMOS transistors N4 and N5, thereby quickening the rising slew of the output signal OUT1.

Figure 5A:
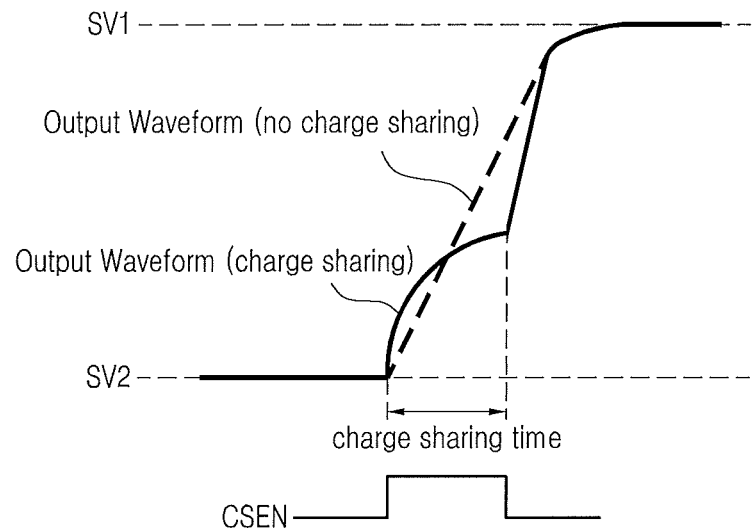
FIG. 5A is a diagram of the waveform of a rising output signal of the first buffer amplifier circuit illustrated in FIG. 4.
Figure 5B:
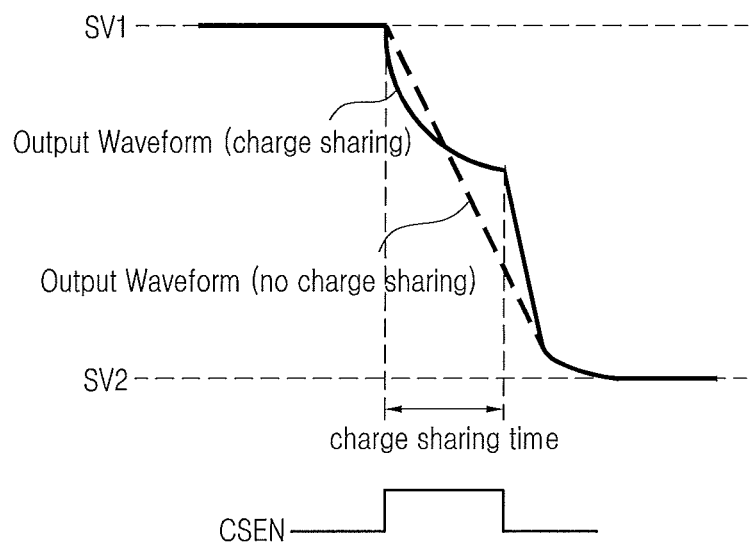
FIG. 5B is a diagram of the waveform of a falling output signal of the first buffer amplifier circuit illustrated in FIG. 4.

FIG. 5A is a diagram of the waveform of a rising output signal of the first buffer amplifier circuit 123-1 illustrated in FIG. 4. FIG. 5B is a diagram of the waveform of a falling output signal of the first buffer amplifier circuit 123-1 illustrated in FIG. 4. In detail, FIG. 5A shows the waveform of the output signal OUT1 when the input signal AIN1 rises in the charge-sharing period (e.g., CSEN=H and CSENb=L) and FIG. 5B shows the waveform of the output signal OUT1 when the input signal AIN1 falls in the charge-sharing period (e.g., CSEN=H and CSENNb=L).

Figure 6:
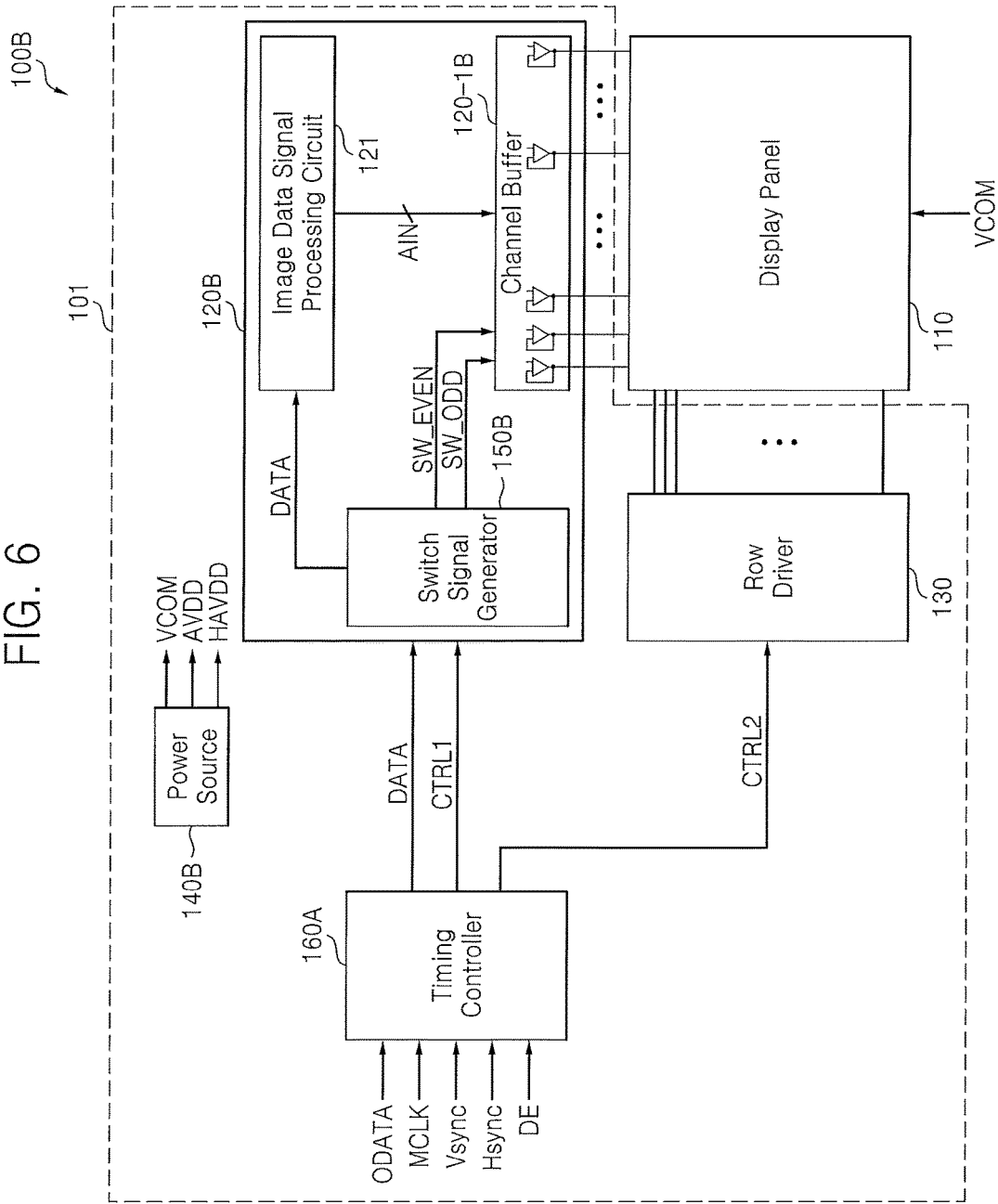
FIG. 6 is a schematic block diagram of a display module according to other aspects of the present inventive concept.

FIG. 6 is a schematic block diagram of a display module 100B according to other aspects of the inventive concept. Apart from a source driver 120B and a power source 140B, the structure and operations of the display module 100B illustrated in FIG. 6 are the same as or similar to those of the display module 100A illustrated in FIG. 5.

The power source 140B generates the first operating voltage AVDD, a second operating voltage HAVDD, and the common voltage VCOM. The first operating voltage AVDD and the second operating voltage HAVDD are applied to the source driver 120B.

The source driver 120B includes a channel buffer 120-1B, the image data signal processing circuit 121, and a switch signal generator 150B. The switch signal generator 150B generates the charge sharing switch signals SW_ODD and SW_EVEN.

Figure 7:
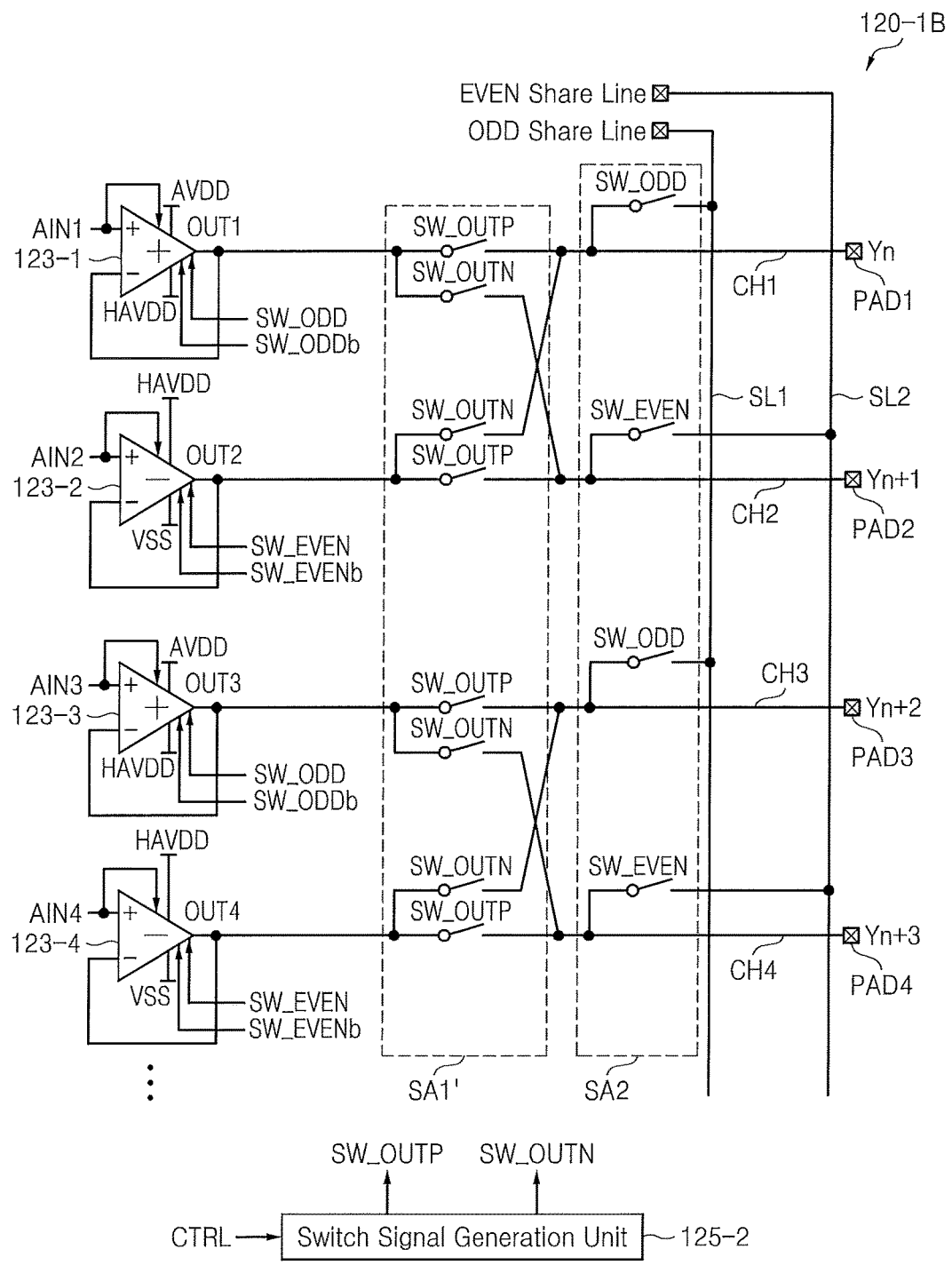
FIG. 7 is a schematic diagram of an embodiment of the display module illustrated in FIG. 6.
Figure 8:
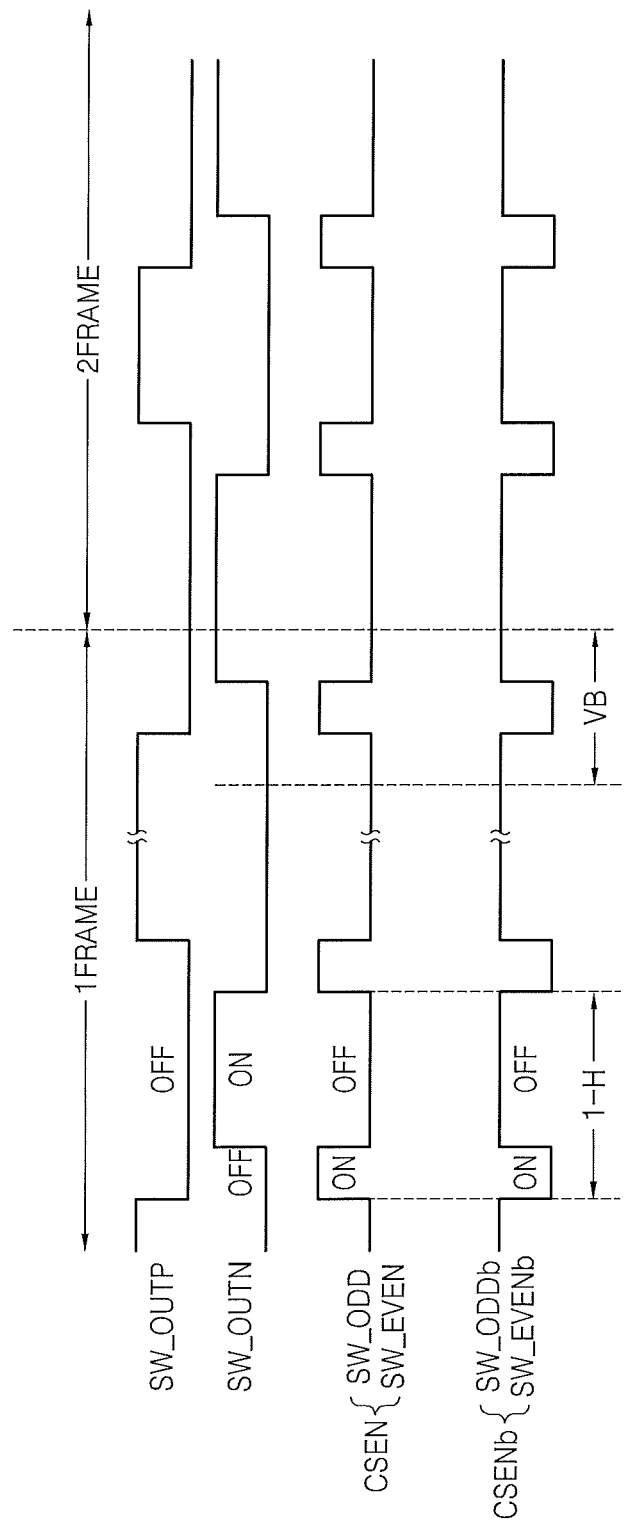
FIG. 8 is a timing chart of control signals for controlling certain of the switches illustrated in FIG. 7.

FIG. 7 is a schematic diagram of an embodiment of the channel buffer 120-1B illustrated in FIG. 6. FIG. 8 is a timing chart of control signals for controlling switches illustrated in FIG. 7.

A switch signal generation unit 125-2 generates switch signals SW_OUTP and SW_OUTN in response to the control signal CTRL.

The odd-numbered buffer amplifier circuits 123-1 and 123-3 among the buffer amplifier circuits 123-1 through 123-4 respectively output the output signals OUT1 and OUT3 which swing between the first operating voltage AVDD and the second operating voltage HAVDD.

The even-numbered buffer amplifier circuits 123-2 and 123-4 among the buffer amplifier circuits 123-1 through 123-4 respectively output the output signals OUT2 and OUT4 which swing between the second operating voltage HAVDD and the ground voltage VSS. For example, the second operating voltage HAVDD may be half of the first operating voltage AVDD but is not restricted thereto.

A first switch array SA1' may include a plurality of switches. The first switch array SA1' transmits output signals of the respective odd-numbered buffer amplifier circuits 123-1 and 123-3 to the odd-numbered source lines CH1 and CH3, respectively, or the even-numbered source lines CH2 and CH4, respectively, in response to the switch signals SW_OUTP and SW_OUTN.

The first switch array SA1' also transmits output signals of the respective even-numbered buffer amplifier circuits 123-2 and 123-4 to the odd-numbered source lines CH1 and CH3, respectively, or the even-numbered source lines CH2 and CH4, respectively, in response to the switch signals SW_OUTP and SW_OUTN.

As shown in FIG. 8, the switch signals SW_ODD and SW_EVEN are activated in the charge sharing period VB, and therefore, charges at each of the source lines CH1 through CH4 may be shared. The switch signals SW_ODD and SW_EVEN may be activated at the same time.

Figure 9:
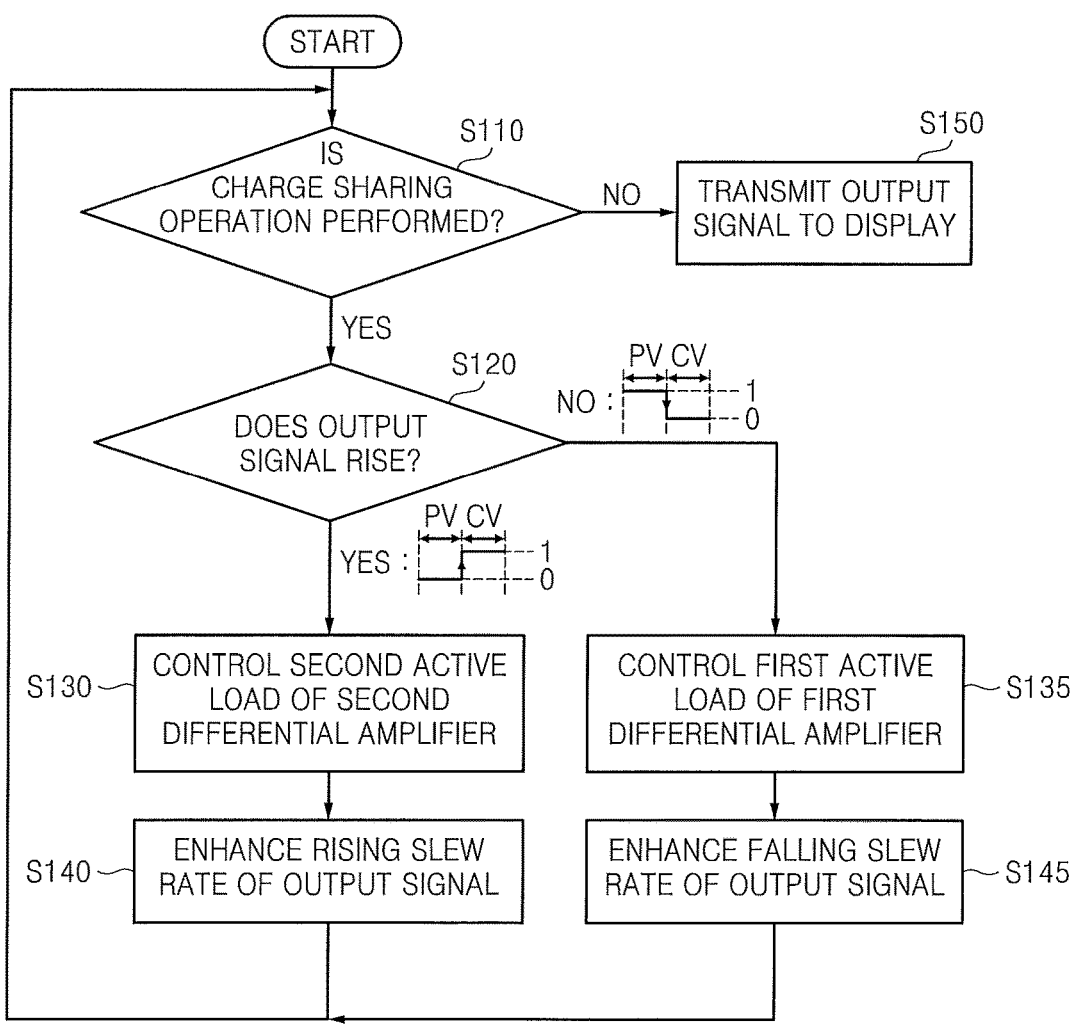
FIG. 9 is a flowchart of the operation of the display module illustrated in FIG. 1 or FIG. 6 according to aspects of the present inventive concept.

FIG. 9 is a flowchart of the operation of the display module 100A or 100B illustrated in FIG. 1 or FIG. 6 according to various aspects of the inventive concept. Referring to FIGS. 1 through 9, when a charge-sharing operation is performed (i.e., in case of YES) in operation S110 and the output signal OUT1 of the buffer amplifier circuit (e.g., 123-1) rises (i.e., in case of YES) in operation S120, the buffer amplifier circuit 123-1 controls the second active load 124-7 of the second differential amplifier 124-3 in operation S130. Accordingly, the buffer amplifier circuit 123-1 enhances the rising slew rate of the output signal OUT1, as shown in FIG. 5A, in operation S140.

When the charge-sharing operation is performed (i.e., in case of YES) in operation S110 and the output signal OUT1 of the buffer amplifier circuit 123-1 falls (i.e., in case of NO) in operation S120, the buffer amplifier circuit 123-1 controls the first active load 124-5 of the first differential amplifier 124-1 in operation S135. Accordingly, the buffer amplifier circuit 123-1 enhances the falling slew rate of the output signal OUT1, as shown in FIG. 5B, in operation S145.

When the charge-sharing operation is not performed (i.e., in case of NO) in operation S110, that is, when the output signal OUT1 is the first voltage SV1 (=AVDD or HAVDD) or the second voltage SV2 (=HAVDD or VSS), the buffer amplifier circuit 123-1 transmits the output signal OUT1 to the display 110.

Figure 10:
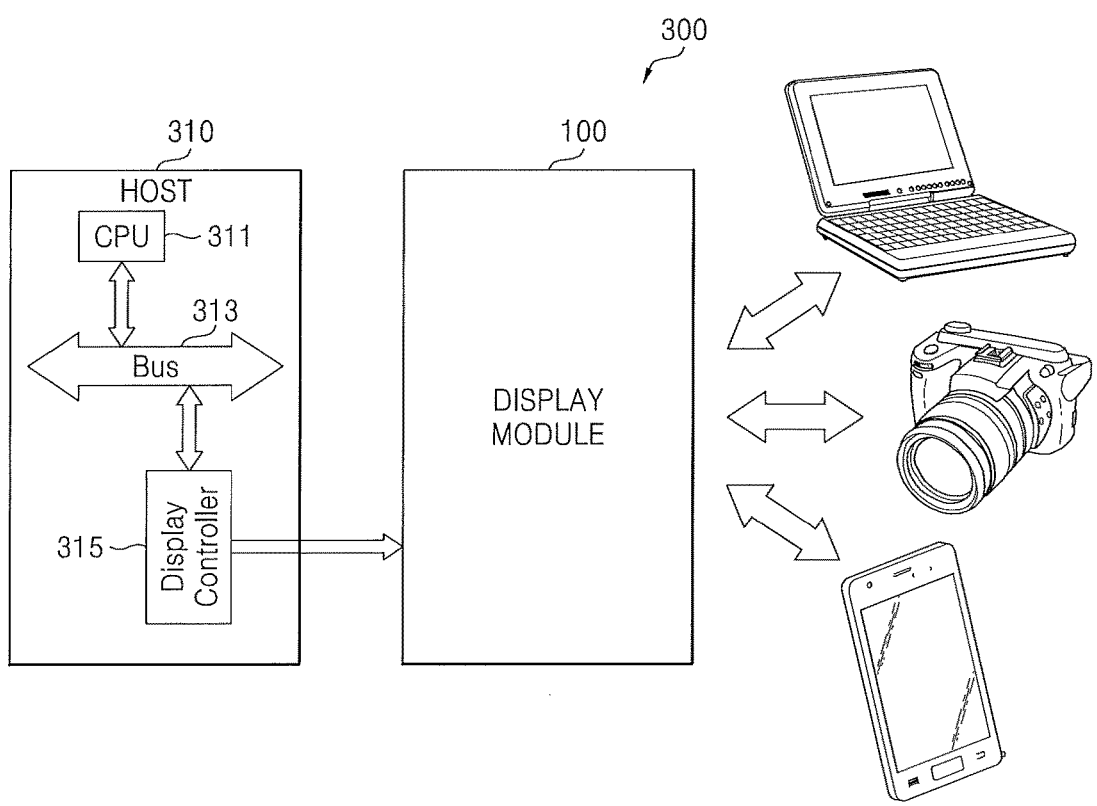
FIG. 10 is a schematic block diagram of a data processing system including the display module illustrated in FIG. 1 or FIG. 6 according to aspects of the present inventive concept.

FIG. 10 is a schematic block diagram of a data processing system 300 including the display module 100A or 100B illustrated in FIG. 1 or FIG. 6 according to various aspects of the inventive concept. Referring to FIGS. 1 through 10, the data processing system 300 may be a mobile device. The mobile device 300 may include a host 310 and the display module 100A or 100B (collective denoted by reference numeral "100").

The host 310 may include a central processing unit (CPU) 311 and a display controller 315. The host 310 may be implemented as an integrated circuit (IC), a system on chip (SoC), an application processor (AP), or a mobile AP, but the inventive concept is not restricted to the current embodiments.

The CPU 311 may control the operation of the display controller 315 through a bus 313. The display controller 315 may control the operation of the display module 100. In detail, the display controller 315 may control the operation of the timing controller 160A.

The mobile device 300 may be a laptop computer, a cellular phone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, an e-book, a mobile internet device (MID), an internet of things (IoT) device, or an internet of everything (IoE) device.

As described above, according to various aspects of the inventive concept, a buffer amplifier circuit including a feedback circuit enhances the slew rate of an output voltage using the feedback circuit during a charge-sharing operation. In addition, the buffer amplifier circuit increases a charge-sharing time, thereby reducing power consumption.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A buffer amplifier circuit comprising:
a buffer amplifier including a first differential amplifier having a first active load and a second differential amplifier having a second active load; and
a feedback circuit configured to feed an output signal of an output terminal of the buffer amplifier back directly to one of the first active load and second active load through transistors gated by differential switch signals and an input signal of the buffer amplifier different from the differential switch signals to enhance a slew rate of the output signal.

2. The buffer amplifier circuit of claim 1, wherein the feedback circuit comprises:
a first transmission circuit configured to transmit the output signal to the first active load in response to the input signal and one of the differential switch signals; and
a second transmission circuit configured to transmit the output signal to the second active load in response to the input signal and the other one of the differential switch signals.

3. The buffer amplifier circuit of claim 1, wherein the first active load enhances a falling slew rate of the output signal and the second active load enhances a rising slew rate of the output signal.

4. The buffer amplifier circuit of claim 3, wherein the first active load includes P-channel metal oxide semiconductor (PMOS) transistors and the output signal of the buffer amplifier controls a gate voltage of the PMOS transistors to enhance the falling slew rate; and
the second active load includes N-channel metal oxide semiconductor (NMOS) transistors and the output signal of the buffer amplifier controls a gate voltage of the NMOS transistors to enhance the rising slew rate.

5. The buffer amplifier circuit of claim 3, wherein the buffer amplifier further comprises:
a pull-up circuit configured to pull the output signal up to a first voltage in response to an output signal of the first active load; and
a pull-down circuit configured to pull the output signal down to a second voltage in response to an output signal of the second active load.

6. A source driver comprising:
a first source line;
a first buffer amplifier circuit connected to the first source line through a first switch; and
a first charge-sharing line connected to the first source line through a second switch,
wherein the first buffer amplifier circuit comprises:
a first buffer amplifier including a first differential amplifier having a first active load and a second differential amplifier having a second active load; and
a first feedback circuit configured to feed a first output signal of a first output terminal of the first buffer amplifier back to one of the first active load and second active load using first differential switch signals related to a control signal for controlling the second switch and a first input signal of the first buffer amplifier to enhance a slew rate of the first output signal.

7. The source driver of claim 6, wherein the first feedback circuit comprises:
a first transmission circuit configured to transmit the first output signal to the first active load in response to the first input signal and one of the first differential switch signals; and
a second transmission circuit configured to transmit the first output signal to the second active load in response to the first input signal and the other one of the first differential switch signals.

8. The source driver of claim 6, wherein the first active load enhances a falling slew rate of the first output signal and the second active load enhances a rising slew rate of the first output signal.

9. The source driver of claim 8, wherein the first active load comprises P-channel metal oxide semiconductor (PMOS) transistors and the first output signal of the first buffer amplifier controls a gate voltage of the PMOS transistors to enhance the falling slew rate; and the second active load comprises N-channel metal oxide semiconductor (NMOS) transistors and the first output signal of the first buffer amplifier controls a gate voltage of the NMOS transistors to enhance the rising slew rate.

10. The source driver of claim 8, wherein the first buffer amplifier further comprises:

a pull-up circuit configured to pull the first output signal up to a first voltage in response to an output signal of the first active load; and a pull-down circuit configured to pull the first output signal down to a second voltage in response to an output signal of the second active load.

11. The source driver of claim 6, further comprising:

a second source line;

a second buffer amplifier circuit connected to the second source line through a third switch; and a second charge-sharing line connected to the second source line through a fourth switch, wherein the second buffer amplifier circuit comprises:

a second buffer amplifier comprising a third differential amplifier having a third active load and a fourth differential amplifier having a fourth active load; and a second feedback circuit configured to feed a second output signal of a second output terminal of the second buffer amplifier back to one of the third and fourth active loads using second differential switch signals related to a control signal for controlling the fourth switch and a second input signal of the second buffer amplifier to enhance a slew rate of the second output signal.

12. The source driver of claim 11, wherein the first source line is one among odd-numbered source lines and the second source line is one among even-numbered source lines.

13. The source driver of claim 11, wherein connection between the first source line and the first charge sharing line and connection between the second source line and the second charge sharing line are performed at the same time.

14. A display system comprising:

a row driver;

a source driver; and a controller connected to the row driver and the source driver, wherein the source driver comprises:

a first source line;

a first buffer amplifier circuit connected to the first source line through a first switch; and a first charge-sharing line connected to the first source line through a second switch, wherein the first buffer amplifier circuit comprises:

a first buffer amplifier comprising a first differential amplifier having a first active load and a second differential amplifier having a second active load; and a first feedback circuit configured to feed a first output signal of a first output terminal of the first buffer amplifier back to one of the first and second active loads using first differential switch signals related to a control signal for controlling the second switch and a first input signal of the first buffer amplifier to enhance a slew rate of the first output signal.

15. The display system of claim 14, wherein the first feedback circuit comprises:

a first transmission circuit configured to transmit the first output signal to the first active load in response to the first input signal and one of the first differential switch signals; and a second transmission circuit configured to transmit the first output signal to the second active load in response to the first input signal and the other one of the first differential switch signals.

16. The display system of claim 14, wherein the first active load enhances a falling slew rate of the first output signal and the second active load enhances a rising slew rate of the first output signal.

17. The display system of claim 16, wherein the first active load comprises P-channel metal oxide semiconductor (PMOS) transistors and the first output signal of the first buffer amplifier controls a gate voltage of the PMOS transistors to enhance the falling slew rate; and the second active load comprises N-channel metal oxide semiconductor (NMOS) transistors and the first output signal of the first buffer amplifier controls a gate voltage of the NMOS transistors to enhance the rising slew rate.

18. The display system of claim 16, wherein the first buffer amplifier further comprises:

a pull-up circuit configured to pull the first output signal up to a first voltage in response to an output signal of the first active load; and a pull-down circuit configured to pull the first output signal down to a second voltage in response to an output signal of the second active load.

19. The display system of claim 14, wherein the source driver further comprises:

a second source line;

a second buffer amplifier circuit connected to the second source line through a third switch; and a second charge sharing line connected to the second source line through a fourth switch, wherein the second buffer amplifier circuit comprises:

a second buffer amplifier comprising a third differential amplifier having a third active load and a fourth differential amplifier having a fourth active load; and a second feedback circuit configured to feed a second output signal of a second output terminal of the second buffer amplifier back to one of the third and fourth active loads using second differential switch signals related to a control signal for controlling the fourth switch and a second input signal of the second buffer amplifier to enhance a slew rate of the second output signal.

20. The display system of claim 19, wherein the first source line is one among odd-numbered source lines, the second source line is one among even-numbered source lines, and connection between the first source line and the first charge sharing line and connection between the second source line and the second charge sharing line are performed at the same time.

\* \* \* \* \*